United States Patent [19]

Faust et al.

[11] 4,245,030

[45] Jan. 13, 1981

[54] PHOTOPOLYMERIZABLE MIXTURE CONTAINING IMPROVED PLASTICIZER

[75] Inventors: Raimund J. Faust, Wiesbaden; Peter Lehmann, Maintal, both of Fed. Rep. of Germany

[73] Assignee: Hoechst Aktiengesellschaft, Fed. Rep. of Germany

[21] Appl. No.: 41,742

[22] Filed: May 23, 1979

[51] Int. Cl.³ .............................................. G03C 1/68
[52] U.S. Cl. .............................. 430/281; 204/159.16; 204/159.19; 430/284; 430/288; 430/905
[58] Field of Search .................... 96/115 R, 115 P; 204/159.14, 159.16, 159.19, 159.18; 525/127; 260/31.2 R; 430/912, 281, 284, 288, 905

[56] References Cited

U.S. PATENT DOCUMENTS

| | | | |
|---|---|---|---|
| 2,198,582 | 4/1940 | Grether et al. | 260/473 |
| 2,198,583 | 4/1940 | Grether et al. | 260/474 |
| 3,192,194 | 6/1965 | Burg | 96/28 |
| 3,395,060 | 7/1968 | Guldner | 166/209 |
| 3,469,982 | 9/1969 | Celeste | 96/35.1 |
| 3,526,504 | 9/1970 | Celeste | 96/35.1 |
| 3,549,367 | 12/1970 | Chang et al. | 204/159.23 |
| 3,615,937 | 10/1971 | Collins et al. | 156/17 |
| 3,782,961 | 1/1974 | Takahashi et al. | 204/159.14 |
| 3,844,790 | 10/1974 | Chang et al. | 96/115 P |
| 3,850,770 | 11/1974 | Juna et al. | 96/115 P |
| 3,895,949 | 7/1975 | Akamatsu et al. | 96/115 P |
| 3,907,574 | 9/1975 | Yonezawa et al. | 96/115 P |
| 4,019,972 | 4/1977 | Faust | 204/159.15 |
| 4,038,078 | 7/1977 | Sakurai et al. | 427/43 |
| 4,078,015 | 3/1978 | Leitheiser | 260/77.5 CR |
| 4,088,498 | 5/1978 | Faust | 204/159.15 |
| 4,116,786 | 9/1978 | Hodakowski | 204/159.16 |
| 4,139,436 | 2/1979 | Jasani | 204/159.19 |

FOREIGN PATENT DOCUMENTS 1441108  6/1976  United Kingdom .

*Primary Examiner*—Jack P. Brammer
*Attorney, Agent, or Firm*—James E. Bryan

[57] ABSTRACT

This invention relates to an improvement in a photopolymerizable mixture, comprising a polymeric binder which is soluble or at least swellable in aqueous-alkaline solutions, a compound with at least two acrylic or methacrylic acid ester groups and a boiling point above 100° C. which is capable of addition polymerization, a photoinitiator, and a plasticizer, the improvement being that the plasticizer is a compound corresponding to Formula I

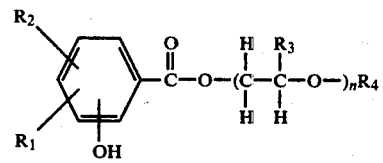

wherein $R_1$ is a hydrogen or halogen atom or an alkyl group with 1 to 4 carbon atoms, $R_2$ is a hydrogen atom, an OH group, or an alkyl group with 1 to 4 carbon atoms, $R_3$ is a hydrogen atom or a methyl group, $R_4$ is an alkyl or alkenyl group with 1 to 20 carbon atoms, and n is zero or a whole number from 1 to 20, and wherein $R_4$ has at least 4 carbon atoms if n is zero or 1. The invention also relates to a light-sensitive transfer material including the photopolymerizable mixture.

9 Claims, No Drawings

PHOTOPOLYMERIZABLE MIXTURE CONTAINING IMPROVED PLASTICIZER

The present invention relates to a photopolymerizable mixture comprising polymeric binders, polymerizable compounds, and photoinitiators.

Mixtures of this type are used in the reproduction field for the manufacture of printing plates, photoresists, i.e. etching and electroplating resists, and relief images which may be colored.

A particular group of such mixtures adapted for the production of photoresists is used in the form of a dry, photopolymerizable layer on a temporary support consisting of a transparent flexible plastic film. Under the influence of pressure and heat, the layer is laminated to a metal support which is to be imagewise modified, e.g. a copper plate, and is then exposed and developed to form the photoresist. Preferably, the layers are capable of being developed with aqueous, usually aqueous alkaline developer solutions. Materials of this type and methods of processing them are disclosed, e.g., in U.S. Pat. Nos. 3,526,504, 3,469,982, 4,088,498, and 4,019,972.

If they are developed with aqueous alkaline solutions, the layers disclosed in the above-mentioned patents have a specially good adhesion to the support, in particular copper supports, and a good resistance to etching solutions and electroplating baths.

The binders required for these materials, which must be soluble or at least swellable in aqueous alkaline solutions, frequently have the drawback that they impart a certain brittleness to the exposed layer. This is particularly true in the case of binders containing monomer units which impart to the polymer a higher glass transition temperature and which are thus preferred because they prevent cold flow of the unexposed layer. Binders of this type are disclosed, e.g., in U. S. Pat. No. 3,930,865.

Monomers containing more than two polymerizable groups in the molecule, which otherwise are particularly advantageous because their exposure products have a high cross-linking density, normally also yield relatively brittle exposure products, especially if exposure is prolonged beyond the optimum exposure time.

Generally, it can be stated that photopolymerizable layers which have a satisfactorily low degree of cold flow in the unexposed state and which, after exposure, show good adhesion to the metal support, good resistance to the developer, and good resistance to etching solutions and electroplating baths, form relatively brittle exposure products. Because this applies particularly to over-exposures, usually there is only a very narrow exposure latitude in the processing of such layers, if optimum combinations of properties are to be achieved. A further embrittlement may occur during storage or handling of the products under daylight.

This increased brittleness of the exposed and even of the unexposed photoresist layers may cause considerable difficulties in the further processing of these layers, e.g. in the production of printed circuits. One of these difficulties is that the brittle resist layer tends to form flakes when the copper circuit boards laminated to the dry resist are cut, thus leading to considerable contamination and interference with the further processing of the material. As another drawback, the brittle resist overhangs tend to break off during etching in conventional spray etching apparatuses, or fine details of photomasks crack off in aggressive electroplating baths, especially in gold baths in which the current yield is relatively low (e.g. from 45 percent down to 25 percent). In this case, hydrogen is formed which may easily cause cracking of brittle resist masks.

Although the described problems have not been clearly outlined before for this combination of layer components and processing conditions, the question of the brittleness of photopolymerizable layers has been studied in principle, and it was recommended to solve the problem by adding plasticizers to the layers. Thus, in U.S. Pat. No. 3,844,790, dibutyl phthalate and other esters of aromatic and aliphatic dicarboxylic acids, further glycol esters, polyglycols, alkyl and aryl phosphates, certain sulfonamides, and other compounds are mentioned as suitable plasticizers for certain types of photopolymerizable layers. These, and other similar plasticizers are also mentioned in U.S. Pat. No. 3,192,194, column 4, and in U.S. Pat. No. 3,895,949.

All the plasticizers disclosed in these publications have certain disadvantages when used in photopolymerizable layers of the above type adapted for alkaline development. Many of them are not compatible with the alkali-soluble binders required and ooze out from the exposed or unexposed layer during storage. Others may have a good plasticizing effect and be compatible, but produce layers with excessive cold-flow in the unexposed state. Still others cause an undesirable reduction of the developer resistance of the exposed areas of the layer, of their resistance to electroplating baths, or their adhesion to the metallic support.

It is the object of the present invention to provide new plasticizers for photopolymerizable mixtures and new layer combinations which do not have the above-mentioned drawbacks. Above all, the unexposed layer should have only an insignificant cold flow and its homogeneity should undergo no changes during storage. After exposure, the layer should have a high cross-linking density and thus a high resistance to developer solutions and electroplating baths, further a good adhesion to metal supports, especially copper supports, but should retain its flexibility even if considerably overexposed.

The invention is based on a photopolymerizable mixture which comprises: a polymeric binder which is soluble or at least swellable in aqueous-alkaline solutions; a compound with at least two acrylic or methacrylic acid ester groups in the molecule and a boiling point above 100° C. which is capable of addition polymerization; a photoinitiator; and a plasticizer.

In the mixture according to the present invention the plasticizer is a compound which corresponds to Formula I

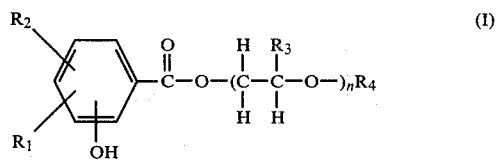

wherein
R₁ is a hydrogen or halogen atom or an alkyl group with 1 to 4 carbon atoms,
R₂ is a hydrogen atom, an OH group, or an alkyl group with 1 to 4 carbon atoms,
R₃ is a hydrogen atom or a methyl group, $R_4$ is an alkyl or alkenyl group with 1 to 20 carbon atoms, and n is zero or a whole number from 1 to 20, and wherein $R_4$ has at least 4 carbon atoms if n is zero or 1.

The mixture according to the present invention normally contains between 1 and 30 percent by weight of the new plasticizers, calculated on the weight of the non-volatile components. Preferably, 10 to 25 percent by weight of plasticizer is added. If more than 30 percent by weight is added, the exposed areas of the layer still possess an excellent flexibility and other advantageous properties, but in this case the cold flow of the unexposed layer is already noticeable and may be annoying when the material is used as a dry resist film. If it is not intended to store the mixture over a relatively long time in the form of a rolled-up unexposed dry layer, i.e. if the mixture is to be stored in dissolved form, as a liquid resist, and is to be applied to the support only immediately prior to its use, this drawback is of no consequence, so that even higher proportions of plasticizer, up to 40 percent by weight, may be used.

If the plasticizers contain oxyalkylene units, i.e. if n is not zero, these units preferably are oxyethylene units ($R_3$=H). The number n of oxyalkylene units preferably is between 1 and 6. Compounds in which n=3 and $R_3$=H show a particularly high resistance to electroplating baths.

The group $R_4$ is derived from an unsaturated, or preferably, from a saturated, straight-chained or branched aliphatic alcohol with 1 to 20 carbon atoms. Even if n is more than 1, the group $R_4$ preferably has from 4 to 20 carbon atoms. On the other hand, of the compounds in which $R_4$ contains 4 or more carbon atoms, those are preferred in which n is at least 1. If n is zero, the group $R_4$ preferably contains at least 6 carbon atoms. Examples of alcohols in which $R_4$ is OH, and which may be used for the preparation of suitable plasticizers are methanol, isopropanol, isoamyl alcohol, n-hexanol, 2,4-dimethyl-hexanol, isooctanol, decanol, octadecyl alcohol and geraniol.

Suitable hydroxybenzene carboxylic acids which may be used for the preparation of compounds corresponding to Formula I are, e.g., salicylic acid, 4-hydroxy-3-chloro-benzoic acid, 2,5-dihydroxy-4-ethyl-benzoic acid, 2,4-dihydroxy-benzoic acid, 4-bromo-3-hydroxy-benzoic acid and 2-hydroxy-4-chloro-6-methyl-benzoic acid. If $R_1$ is a halogen atom, it preferably is chlorine or bromine. Compounds in which $R_1$ stands for hydrogen or alkyl are generally preferred.

The new plasticizers are readily compatible with the other components of the layer, in particular with the preferred binders and monomers referred to below. Even if they are stored for a relatively long time at relatively high temperatures, e.g. at 50° C. or even 100° C., they have no tendency to migrate from the layer. Also, no migration takes place in the conventionally used acid electroplating baths. By means of the inventive plasticizers, photopolymerizable layers are obtained which are excellently flexible before and especially after exposure. In combination with suitable binders and monomers, they yield layers which have only a very slight cold flow or no cold flow at all. Furthermore, it was found that when plasticizers according to the invention are used the resistance of exposed layers to electroplating baths, especially to acid gold baths, is surprisingly improved, as compared with layers containing no plasticizers, although other known plasticizers frequently decrease the resistance to electroplating baths. The desired combination of properties which normally are hard to reconcile with each other, is even maintained if the layer is substantially over-exposed, so that the consumer is spared the expensive and troublesome task of exactly determining the optimum exposure time for each original and each light source used.

Compounds according to Formula I wherein n=1 or more have not yet been disclosed in the literature. Some of the compounds in which n=0 are known; thus, the 2-ethyl-hexyl ester of 4-hydroxy benzoic acid, e.g., is known as a plasticizer for polyamides and polyvinyl chloride. It is frequently mentioned in connection with N-alkyl-phenyl sulfonamide or N-alkyl toluene sulfonamide (e.g. in German Auslegeschrift No. 1,283,796 and in U.S. Pat. No. 3,395,060). These publications do not indicate, however, that the plasticizer is also suitable for photopolymerizable mixtures of the above described type. N-alkyl-toluene sulfonamide, e.g. which is described as being equivalent, is completely unsuitable for this purpose and crystallizes or exudes from the solid mixture.

The plasticizers according to the present invention may be easily prepared from alcohols, by azeotropic esterification with aromatic carboxylic acids. The following alcohols may be used:

(a) aliphatic monohydric alcohols with 4 to 20 carbon atoms, (b) polyglycol monalkyl ethers obtained by reacting aliphatic monohydric alcohols having from 1 to 20 carbon atoms with ethylene oxide or propylene oxide.

The preparation of polyglycol monalkyl ethers from alcohols and alkylene oxides is known. Compounds of this type are commercially available.

The photopolymerizable mixtures according to the present invention further contain polymeric, preferably thermoplastic binders which are soluble or at least swellable in aqueous-alkaline solutions. Polymers of this type contain groups which form salts in an alkaline medium, e.g. COOH, $PO_3H_2$, $SO_3NH_2$, $SO_2NHCO$, or OH groups. Polymers containing carboxyl groups are preferred. Maleic acid resins, polymers of N-(p-toluenesulfonyl)-carbamic acid-($\beta$-methacryloxyloxy)-ethyl ester, and copolymers of such monomers, further styrene-maleic acid anhydride copolymers and in particular, acrylic and methacrylic acid copolymers may be used as binders. The latter compounds may contain alkyl acrylates and alkyl methacrylates as comonomers, of which at least some have alkyl groups with 4 to 15 carbon atoms, and, additionally, styrene, substituted styrene, acrylonitrile, benzyl acrylate, or a similar monomer forming a homopolymer with a glass transition temperature Tg of at least 80° C. Such preferred binders are disclosed in U.S. Pat. Nos. 3,804,631, and 3,930,865. The binder should have an average molecular weight of at least 10,000, preferably of about 20,000 to 200,000. Normally, the acid number is between 50 and 250, preferably between 100 and 200. Terpolymers of methacrylic acid, an alkyl-methacrylate with 4 to 12 carbon atoms in the alkyl group, and styrene or substituted styrene are preferred. As a rule, the binder content is in the range from 20 to 80 percent by weight, preferably between 35 and 65 percent by weight of the non-volatile components of the mixture.

Furthermore, the mixtures according to the invention comprise polymerizable compounds with at least 2 acrylic or methacrylic acid ester groups in the molecule. Compounds of this type are known in large numbers and are conventionally used for the preparation of photopolymerizable compositions. Examples of suitable compounds are, e.g.: ethylene glycol diacrylate, di-, tri- and polyethyleneglycol-diacrylates, hexanediol-(1,6)-diacrylate, tri-methylol-propane-triacrylate, trimethylol-ethane-diacrylate, pentaerythritol-triacrylate, neopentylglycol diacrylate, diglycerol diacrylate, and the corresponding methacrylates. Acrylic and methacrylic acid amides, e.g. methylene-bis-acrylamide, hexamethylene-bis-acrylamide, or xylylene-bis-methacrylamide, also may be used in combination with the esters. Acrylic and methacrylic acid esters containing at least two urethane groups in their molecules are preferred, because these monomers form exposure products which are distinguished by their good flexibility and adhesion to metals. The compounds also may include biuret groups and, if desired, carboxylic acid amide groups. Compounds of this type are disclosed in U.S. Pat. Nos. 4,088,498, 4,019,972, and 3,850,770. Reaction products of 2 moles of hydroxyalkyl acrylate or -methacrylate and 1 mole of a diisocyanate, e.g. hexamethylene-diisocyanate, 2,2,4-trimethyl-hexamethylene-diisocyanate, isophoron-diisocyanate, dicyclohexyl-methane-diisocyanate, or tolylene-diisocyanate, are mentioned as examples. Aliphatic and cycloaliphatic diisocyanates with 2 to 12 carbon atoms are generally preferred, and among these those which contain at least one lateral methyl group. Furthermore, those monomers are used with advantage which contain at least one oxyalkylene unit, preferably oxyethylene units, in the molecule. The reaction products of hydroxyl group containing acrylates and methacrylates with diisocyanates produced by the partial reaction of the above-mentioned simple diisocyanates, with diols, e.g. hexane diol, diethyleneglycol, triethylene glycol, pentaethylene glycol, tripropylene glycol and the like, are mentioned as examples. These compounds with terminal isocyanate groups may contain one or more diol or polyether groups.

Polymerizable compounds obtained by reaction of the above mentioned preferred diisocyanates with di-, tri-, or tetra-ethylene-glycol, in a molar ratio from 2:1 to 1.1:1, followed by reaction of the resulting reaction product with 1 mole of 2-hydroxy-ethyl methacrylate per equivalent of isocyanate groups, are particularly preferred.

For the preferred application of the mixtures according to the invention in the preparation of dry resist films, the methacrylates are generally preferred. Polymerizable compounds containing two terminal polymerizable double bonds are particularly preferred. As a rule, the monomers are used in quantities ranging from 10 to 70 percent by weight, preferably from 20 to 50 percent by weight, calculated on the weight of the non-volatile components of the mixture.

A great number of substances may be used as photoinitiators. Benzoin, benzoin ether, multi-nuclear quinones, e.g. 2-ethyl-anthraquinone, acridine derivatives, e.g. 9-phenyl-acridine, 9-p-methoxyphenyl-acridine, 9-acetyl-amino-acridine or benz(a)acridine, phenazine derivatives, e.g. 9,10-dimethyl-benz(a)phenazine, 9-methyl-benz(a)phenazine, 10-methoxy-benz(a)phenazine, quinoxaline derivatives, e.g. 6,4',4''-trimethoxy-2,3-diphenyl-quinoxaline or 4',4''-dimethoxy-2,3-diphenyl-5-aza-quinoxaline, quinazoline derivatives, and others are mentioned as examples. As a rule, their quantity is in the range from 0.1 to 10 percent of the weight of the non-volatile components of the mixture.

In addition to monomers, plasticizers, photoinitiators and binders, the mixture according to the present invention may include a number of further conventional additives, such as inhibitors to prevent thermal polymerization of the monomers, adhesion-promoting agents, hydrogen donors, sensitometric regulators, dyes, colored or uncolored pigments, color couplers and indicators.

Advantageously, these additives should be selected in a manner such that they do not excessively absorb within the actinic wave length range essential for the initiating process.

The photopolymerizable mixture according to the present invention may be marketed in known manner as a solution or dispersion, which the consumer uses in particular for the preparation of etch resists. Preferably, however, the mixtures according to the invention are used for the preparation of dry resist films which consist of a ready-made photoresist layer on a temporary support, e.g. a transparent plastic film. Such dry resist films are laminated by the consumer to the support on which an image is to be formed by etching or electroplating and are then exposed and developed in situ, the temporary support being removed before development.

The mixture according to the present invention is particularly suitable for this type of use. Alternatively, it may be manufactured as a presensitized copying material on a suitable support, e.g. aluminum or zinc, for the photomechanical production of offset or letterpress printing forms. Moreover, it is suitable for the production of relief images, screen printing stencils, color proofing films and the like. The advantages of the present material are effective in all cases where good and lasting flexibility of the exposed layer, low cold flow of the unexposed layer, and high resistance of the exposed layer to aggressive chemicals are of importance.

The light-sensitive materials containing the mixture according to the present invention are prepared in known manner. Thus, a solvent may be added to the mixture and the resulting solution or dispersion may be applied to the support by casting, spraying, immersion, roller application, or some other method, and the resulting film dried. Thicker layers (e.g. of 250 μm or more) may be prepared, as a self-supporting film, by extrusion or molding and the film is then laminated to the support.

Suitable supports for the copying layers containing the mixtures according to the invention are metals, e.g. aluminum, zinc, copper, steel, chromium, brass, and other metal alloys, further supports for screen printing stencils, e.g. nickel or perlon gauze, and, plastic films, e.g. polyester films, especially surface-treated plastic films.

The copying layers according to the invention are exposed and developed in the conventional manner. Suitable developers are aqueous, or preferably aqueous-alkaline solutions, e.g. alkali phosphate or alkali silicate solutions, to which, if desired, small quantities, e.g. up to 10 percent by weight, but preferably less than 5 percent by weight, of water-miscible organic solvents or wetting agents may be added. Development may be effected by manual treatment, or by treatment in commercial spray development or brush development apparatuses.

As already mentioned, the mixtures according to the present invention may be used for very different purposes. As a particularly advantageous application, they are used for the production of photoresist or etch resist layers on metal supports. They are particularly suitable for use on copper supports. In this preferred application, the excellent adhesion and flexibility of the exposed areas of the layer are of advantage not only during development, but also during the following etching of the support wherein the layers display good flexibility and etch resistance.

The mixtures may be used and handled with particular advantage in the form of the so-called dry resist materials mentioned above, because even dry layers are capable of being transferred onto metal supports and forming firmly adhering layers thereon. In this case, polyester films may be used with particular advantage as temporary supporting films.

In the following examples, some embodiments of the inventive mixture are described. Unless stated otherwise, percentages and proportions are by weight.

EXAMPLE 1a

A solution of:
6.5 g of a terpolymer of n-hexylmethacrylate, methacrylic acid, and styrene (60:30:10) with an average molecular weight of about 35,000,
2.8 g of a polymerizable diurethane obtained by reacting 1 mole of 2,2,4-trimethyl-hexamethylene-diisocyanate with 2 moles of hydroxyethyl methacrylate,
2.8 g of a polymerizable polyurethane, obtained by reacting 11 moles of 2,2,4-trimethyl-hexamethylene-diisocyanate with 10 moles of anhydrous triethylene glycol and further reacting the resulting reaction product with 2 moles of hydroxyethyl-methacrylate,
0.2 g of 9-phenyl-acridine,
0.1 g of 3-mercapto-propionic acid-2,4-dichloro-anilide,
0.035 g of a blue azo dye, obtained by coupling 2,4-dinitro-6-chlorobenzene-diazonium salt with 2-methoxy-5-acetylamino-N-cyanoethyl-N-hydroxyethyl-aniline, and
2.8 g of the ester of 2,6-dihydroxy-benzoic acid with diethyleneglycolmono-2-ethylhexyl ether, in
35.0 g of methylethyl ketone, and
2.0 g of ethanol,
is whirler-coated onto a 25 μm thick, biaxially stretched and heat set polyethylene terephthalate film in a manner such that, after drying at 100° C., the layer weighs 28 g/m$^2$.

The resulting dry resist film is laminated by means of a commercial laminating apparatus, at 120° C., to a laminated phenoplast panel provided with a 35 μm thick copper foil and is then exposed for 8 seconds in a commercial exposure device. The master used is a line original, in which the lines and the distances between lines have widths down to 80 μm.

After exposure, the polyester film is stripped off and the layer is developed within 50 seconds with a 0.8 percent Na$_2$CO$_3$ solution in a spray developing apparatus.

The plate is then rinsed for 30 seconds with tap water, superficially etched for 1 minute with a 25 percent ammonium peroxy disulfate solution and then consecutively electroplated in the following electrolyte baths:
1. For 40 minutes in a copper electrolyte bath marketed by Messrs. Blasberg, Solingen, under the designation "Feinkornkupferplastic-Bad"; Current density: 2 A/dm$^2$; Thickness of the metal layer produced: about 20 μm.
2. For 10 minutes in a nickel bath of type "Norma" marketed by Messrs. Blasberg, Solingen: Current density: 4 A/dm$^2$; Thickness of the metal layer produced: 6 μm,
3. For 15 minutes in a gold bath of type "Autronex N", marketed by Messrs. Blasberg, Solingen: Current density: 0.6 A/dm$^2$; Thickness of the metal layer produced: 2.5 μm.

The plate shows no undercutting or damage.

The plate may then be decoated in a 5 percent KOH solution at 50° C. and the bared copper areas may be etched away by conventional etching means.

Even after 10-times overexposure, i.e. after an exposure time of 80 seconds in the above-described exposure apparatus, the above-described dry resist film is entirely flexible. This can be proved by manually stretching an about 2 cm wide and 20 cm long strip of the exposed material consisting of the support and the layer. At room temperature, the 10-times overexposed strip of dry resist film may be stretched to at least twice its original length without cracking or tearing of the layer.

This flexibility is of decisive importance for many processing steps, such as cutting of the laminated material, etching, gold-plating and others. The above described dry resist film has a very low cold flow in the unexposed state, so that rolls can be stored for long periods of time without the resist layer squeezing out at the edges.

EXAMPLES 1b to 1g

Instead of the plasticizer used in Example 1a, either of the following plasticizers may be used:
(1b) 2.8 g of the ester of 2,4-dihydroxy-benzoic acid and diethyleneglycolmono-2-ethylhexyl ether. Layer weight: 29 g/m$^2$; Exposure time: 6 seconds; Processing: as described above, the same good resistance to electroplating baths being obtained; Flexibility: even after 10-times overexposure the material can be stretched without tearing or embrittlement of the layer.
(1c) 2.8 g of the ester of 2,6-dihydroxy-benzoic acid and triethyleneglycolmono-2-ethylhexyl ether. Results: as above. Layer weight: 27 g/m$^2$.
(1d) 2.8 g of the ester of 2,6-dihydroxy-benzoic acid and tripropyleneglycolmono-2-ethylhexyl-ether. Results: as above. Layer weight: 27 g/m$^2$.
(1e) 2.8 g of the ester of 2,6-dihydroxy-benzoic acid and hexaethyleneglycol-mono-2-ethylhexyl- ether. Results: as above. Layer weight: 27 g/m$^2$.
(1f) 2.8 g of the ester of 4-hydroxy-toluene-2-carboxylic acid and diethyleneglycol-monohexyl ether. Results: as above. Layer weight: 32 g/m$^2$.
(1g) 2.8 g of 4-hydroxy-toluene-2-carboxylic acid-n-hexylester. Results: as above. Layer weight: 32 g/m$^2$.

COMPARATIVE EXAMPLE 1h

If a solution is prepared from
6.5 g of the terpolymer used in Example 1a,
2.8 g of the diurethane used in Example 1a,
2.8 g of the polyurethane used in Example 1a,
0.2 g of 9-phenyl-acridine,
0.1 g of 3-mercapto-propionic acid-2,4-dichloro-anilide,
0.035 g of the dye used in Example 1a, p1 35.0 g of methylethyl ketone, and
2.0 g of ethanol
(i.e. without the addition of a plasticizer), a dry resist film results which is relatively brittle after normal exposure time and which cracks and splinters when the material is manually stretched after increasing the exposure time by 50%.

COMPARATIVE EXAMPLE 1i

A solution is prepared from
6.5 g of the terpolymer used in Example 1a,
5.6 g of the diurethane used in Example 1a,
2.8 g of the polyurethane used in Example 1a,
0.2 g of 9-phenyl-acridine,
0.1 g of 3-mercapto-propionic acid-2,4-dichloro-anilide,
0.035 g of the dye used in Example 1a,
35.0 g of methylethyl ketone and
2.0 g of ethanol
and is applied, in the manner described in Example 1a, to a support, a layer weighing 30 g/m$^2$ being the result. After an exposure time of only 10 seconds, this layer becomes brittle and splinters.

EXAMPLE 2a

A solution of
6.5 g of the terpolymer used in Example 1a,
2.8 g of the diurethane used in Example 1a,
2.8 g of the polyurethane used in Example 1a,
0.2 g of 9-phenyl-acridine,
0.1 g of 3-mercapto-propionic acid-2,4-dichloro-anilide,
0.035 g of the dye used in Example 1a, and
2.8 g of a plasticizer obtained by azeotropic esterification of 4-hydroxy-benzoic acid with triethyleneglycol-mono-tridecyl ether (commercial product),
35.0 g of methyl ethyl ketone and
2.0 g of ethanol,
is processed as described in Example 1a to yield a dry resist film weighing 28 g/m$^2$.

After an exposure of only 8 seconds in the exposure apparatus used in Example 1a, an optimally exposed circuit board is obtained which yields a true copy of the line original after development in a 0.8 percent Na$_2$CO$_3$ solution.

The resist remains flexible and does not crack or break even if it is 10-times overexposed.

EXAMPLE 2b

The plasticizer used in Example 2a is replaced by 2.8 g of the salicylic acid ester of triethylene-glycol-monoethyl ether. Layer weight of the dry resist film: 29.4 g/m$^2$; Exposure time: 10 seconds; Development: 70 seconds in 0.8 percent Na$_2$CO$_3$ solution. Resistance to electroplating baths: very good, even to gold baths (see Example 1a). Flexibility: even after an exposure time of 80 seconds, the resist layer is completely flexible and does not break or splinter if it is stretched.

EXAMPLES 2c to 2g

Similar results are obtained if the plasticizer used in Example 2a is replaced by 2.8 g of one of the following compounds:
(2c) ester of 4-hydroxy-benzoic acid and triethyleneglycolmonobutyl-ether
(2d) ester of 4-hydroxy-benzoic acid and 2-ethyl-hexanol
(2e) ester of 4-hydroxy-benzoic acid and isotridecyl alcohol
(2f) ester of 3-hydroxy-benzoic acid and 2-ethyl-hexanol
(2g) ester of 4-hydroxy-benzoic acid and hexaethyleneglycolmono-2-ethylhexyl-ether.

In all cases layers weighing around 30 g/m$^2$ are obtained which remain flexible, even if the dry resist films are grossly overexposed (e.g. 160 seconds exposure time in the exposure apparatus used in Example 1a). The resistance of these layers to electroplating baths is excellent.

EXAMPLE 3a

A solution of
6.5 g of the terpolymer used in Example 1a,
5.0 g of a polymerizable polyurethane obtained by reacting 2 moles of 2,2,4-trimethyl-hexamethylene-diisocyanate with 1 mole of triethyleneglycol and further reacting the reaction product with 2 moles of hydroxyethylmethacrylate,
2.8 g of 4-hydroxy-benzoic acid-2-ethylhexyl ester,
0.2 g of 9-phenyl-acridine, and
0.025 g of the dye "Disperse Red" (Color Index No. 179), in 25.0 g of methyl ethyl ketone and
2.0 g of ethanol,
is whirler-coated onto a polyester film as described in Example 1a and then dried in a manner such that the resulting layer weighs 52 g/m$^2$. The coated film is exposed for 20 seconds through a film original comprising groups of lines of different widths, using the exposure apparatus mentioned in Example 1a.

After 120 seconds development in a spray developing apparatus, using a 0.8 percent sodium carbonate solution, even lines of a width of 50 μm are resolved. A test of the resistance to electroplating baths, carried through with the electroplating baths used in Example 1a, yields good results; no undercutting or cracking of the resist lines is observed in the critical gold bath.

The flexibility is very good, even after an exposure time of 160 seconds.

The developer resistance is at least 6 minutes, even in lines only 50 μm wide.

EXAMPLE 3b (COMPARATIVE EXAMPLE)

If the plasticizer is omitted from the composition used in Example 3a, relatively brittle layers, which break when bent and cannot be stretched, are obtained after normal exposure. The resistance to the gold bath described in Example 1a is not sufficient.

EXAMPLE 3c (COMPARATIVE EXAMPLE)

If the plasticizer used in Example 3a is replaced by the same quantity (2.8 g) of the monomer used in this example, i.e. if 7.8 g of the monomer is used without the addition of a plasticizer, the same poor results are obtained as in Example 3b.

EXAMPLE 4a

A solution of
6.5 g of the terpolymer used in Example 1a,
5.0 g of the polymerizable polyurethane used in Example 3a,
2.8 g of the 4-hydroxy-benzoic acid ester of triethylene-glycol-mono-2-ethylhexyl ether,
0.2 g of 9-phenyl-acridine, and
0.025 g of "Disperse Red" as a dye (C.I. 179), in 25.0 g of methylethyl ketone and
2.0 g of ethanol, is whirler-coated onto a polyester film as described in Example 1a and dried in a manner such that a layer weighing 51 g/m$^2$ is produced. If the material is processed as described in Example 3a, substantially the same results are obtained as in Example 3a.

EXAMPLE 4b (COMPARATIVE EXAMPLE)

Example 4a is repeated, except that the plasticizer mentioned in the example is replaced by the same quantity of diisodecyl-adipate, a compound which is commercially used as a plasticizer for polymers. After an exposure of only 15 seconds the layer becomes brittle. In addition, its adhesion to copper is poor.

EXAMPLE 4c (COMPARATIVE EXAMPLE)

Example 4a is repeated, except that the plasticizer mentioned in the example is replaced by the same quantity of
(1) the polyester of adipic acid and 1,2-propane-diol, or
(2) the polyester of adipic acid and butane-diol.

Both compounds are commercially available plasticizers. Even after normal exposure (20 seconds), brittle resist layers are obtained. Moreover, the adhesion of the layers to copper is poor.

EXAMPLE 5a

A solution of
6.5 g of the terpolymer used in Example 1a,
5.0 g of the polymerizable diurethane used in Example 1a,
2.8 g of 4-hydroxy-benzoic acid-nerolidyl ester,
0.2 g of 9-phenyl-acridine, and
0.025 g of "Disperse Red" as a dye (C.I. 179) in 25.0 g of methyl-ethyl ketone, and
2.0 g of ethanol,
is whirler-coated onto a polyester film as described in Example 1a and is dried in a manner such that a layer weighing 50 g/m² results. The layer is processed as described in Example 3a. Even if the normal exposure time is exceeded by 200 percent, the exposed resist layer is sufficiently flexible.

EXAMPLE 5b (COMPARATIVE EXAMPLE)

Example 5a is repeated, except that the plasticizer used in Example 5a is replaced by the same quantity of N-ethyl-p-toluene-sulfonamide (a commercially available plasticizer). Immediately after preparation of the resist layer, the flexibility of the layer after normal and prolonged exposure is good, but after storing the unexposed layer for 2 or 3 days, signs of embrittlement are apparent after exposure. After 4 weeks storage, substantial portions of the plasticizer are lost by migration and the resist film has become useless.

EXAMPLE 5C (COMPARATIVE EXAMPLE)

Example 5a is repeated, except that the plasticizer used in Example 5a is replaced by the same quantity of (1) diisooctyl phthalate, or (2) tricresyl phosphate. Brittle layers are produced by normal exposure (20 seconds).

If the same quantity of (3) polyethyleneglycol with an average molecular weight of 1,000 is used as the plasticizer, a layer is obtained whose adhesion to copper is no longer sufficient.

It will be obvious to those skilled in the art that many modifications may be made within the scope of the present invention without departing from the spirit thereof, and the invention includes all such modifications.

What is claimed is:

1. In a photopolymerizable mixture, comprising a polymeric binder which is soluble or at least swellable in aqueous-alkaline solutions, a compound with at least two acrylic or methacrylic acid ester groups and a boiling point above 100° C. which is capable of addition polymerization, a photoinitiator, and a plasticizer, the improvement that the plasticizer is a compound corresponding to Formula I

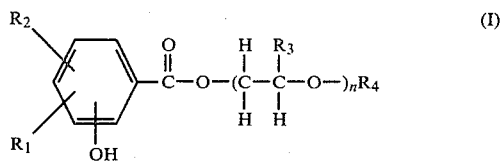

wherein
$R_1$ is a hydrogen or halogen atom or an alkyl group with 1 to 4 carbon atoms,
$R_2$ is a hydrogen atom, an OH group, or an alkyl group with 1 to 4 carbon atoms,
$R_3$ is a hydrogen atom or a methyl group,
$R_4$ is an alkyl or alkenyl group with 1 to 20 carbon atoms, and
n is zero or a whole number from 1 to 20,
and wherein $R_4$ has at least 4 carbon atoms if n is zero or 1.

2. A photopolymerizable mixture according to claim 1 in which the plasticizer is a compound corresponding to Formula I wherein $R_3$ is a hydrogen atom.

3. A photopolymerizable mixture according to claim 1 in which the plasticizer is a compound corresponding to Formula I wherein $R_4$ is an alkyl group with 4 to 20 carbon atoms.

4. A photopolymerizable mixture according to claim 2 in which the plasticizer is a compound corresponding to Formula I wherein n=3.

5. A photopolymerizable mixture according to claim 1 which contains between about 1 and 30 percent by weight of plasticizer, calculated on the weight of the non-volatile components.

6. A photopolymerizable mixture according to claim 1 which contains a polymerizable compound containing at least two urethane groups.

7. A photopolymerizable mixture according to claim 1 in which the polymerizable compound contains two acrylic or methacrylic acid ester groups in the molecule.

8. A photopolymerizable mixture according to claim 1 in which the binder is an acrylic acid or methacrylic acid copolymer with an acid number between 50 and 250.

9. A photopolymerizable mixture according to claim 8 in which the copolymer is a terpolymer of methacrylic acid, an alkylmethacrylate with 4 to 15 carbon atoms in the alkyl group, and a further monomer which can be copolymerized with the first two components and the homopolymer of which has a glass transition temperature of at least 80° C.

* * * * *